United States Patent
Sreenivasan et al.

(10) Patent No.: US 10,191,368 B2
(45) Date of Patent: Jan. 29, 2019

(54) MULTI-FIELD OVERLAY CONTROL IN JET AND FLASH IMPRINT LITHOGRAPHY

(71) Applicant: Board of Regents, The University of Texas System, Austin, TX (US)

(72) Inventors: Sidlgata V. Sreenivasan, Austin, TX (US); Paras Ajay, Austin, TX (US); Anshuman Cherala, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/344,446

(22) Filed: Nov. 4, 2016

(65) Prior Publication Data

US 2017/0131640 A1 May 11, 2017

Related U.S. Application Data

(60) Provisional application No. 62/251,177, filed on Nov. 5, 2015.

(51) Int. Cl.
*G03F 7/00* (2006.01)
*G03F 9/00* (2006.01)

(52) U.S. Cl.
CPC .......... *G03F 7/0002* (2013.01); *G03F 9/7042* (2013.01)

(58) Field of Classification Search
CPC .................................................. G03F 7/0002
See application file for complete search history.

(56) References Cited

U.S. PATENT DOCUMENTS

| 7,170,589 B2 | 1/2007 | Cherala et al. |
| 7,298,456 B2 | 11/2007 | Cherala et al. |
| 7,420,654 B2 | 9/2008 | Cherala et al. |
| 7,727,453 B2 | 6/2010 | Sreenivasan et al. |
| 7,768,624 B2 | 8/2010 | Cherala et al. |
| 2006/0172549 A1 | 8/2006 | Choi et al. |
| 2010/0304280 A1* | 12/2010 | Hatano ............. B82Y 10/00 430/5 |

(Continued)

FOREIGN PATENT DOCUMENTS

| JP | 06204116 A | 7/1994 |
| JP | 2004-259985 A | 9/2004 |

OTHER PUBLICATIONS

Cherala et al., "Nanoscale Magnification and Shape Control System for Precision Overlay in Jet and Flash Imprint Lithography," IEEE/ASME Transactions on Mechatronics, vol. 20, No. 1, Feb. 2015, pp. 122-132.

(Continued)

*Primary Examiner* — Michelle M Iacoletti
(74) *Attorney, Agent, or Firm* — Robert A. Voigt, Jr.; Winstead, P.C.

(57) ABSTRACT

Techniques for delivering sub-5 nm overlay control over multiple fields. One such technique reduces overlay from the wafer side using wafer-thermal actuators. In another technique, the topology of the template is optimized so that the inter-field mechanical coupling between fields in the multi-field template is reduced thereby allowing overlay to be simultaneously reduced in multiple fields in the template. A further technique combines the wafer-thermal and template actuation techniques to achieve significantly improved single and multi-field overlay performance.

15 Claims, 19 Drawing Sheets

(56) References Cited

U.S. PATENT DOCUMENTS

| | | | |
|---|---|---|---|
| 2012/0112387 A1* | 5/2012 | Landis | B82Y 10/00 264/404 |
| 2013/0093113 A1 | 4/2013 | Hayashi et al. | |
| 2015/0091199 A1* | 4/2015 | Murakami | G03F 7/0002 264/40.6 |
| 2015/0108674 A1 | 4/2015 | Murakami et al. | |

OTHER PUBLICATIONS

Bailey Anderson Yin, "Dual Field Nano Precision Overlay," Master's Thesis, Aug. 2010, pp. 1-40.

International Technology Roadmap for Semiconductors, "Process Integration, Devices, and Structures," 2013, pp. 1-47.

Choi et al., "Distortion and Overlay Performance of UV Step and Repeat Imprint Lithography," Microelectronic Engineering, 2005, vol. 78-79, pp. 633-640.

Tai et al., "Structural Topology Optimization Using a Genetic Algorithm with a Morphological Geometric Representation Scheme," Struct. Multidisc. Optim., vol. 30, 2005, pp. 113-127.

Jakiela et al., "Continuum Structural Topology Design with Genetic Algorithms," Comput. Methods Appl. Mech. Engrg., vol. 186, 2000, pp. 339-356.

Chou et al., "Imprtin Lithography with 25-Nanometer Resolution," Scinece, New Series, vol. 272, Issue 5258, Apr. 5, 1996, pp. 85-87.

Hua et al., "Polymer Imprint Lithography with Molecular-Scale Resolution," Nano Letters, vol. 4, No. 12, 2004, pp. 2467-2471.

Lattard et al., "Spacer Process and Alignment Assessment for SADP Process," Proc. of SPIE, vol. 8326, 2012, pp. 1-8.

Son et al., "Assembly of Sub-10-nm Block Copolymer Patterns with Mixed Morphology and Period Using Electron Irradiation and Solvent Annealing," Nano Letters, vol. 11, 2011, pp. 5079-5084.

Ye et al., "Defect Reduction for Semiconductor Memory Applications Using Jet and Flash Imprint Lithography," J. Micro/Nanolith. MEMS MOEMS, vol. 11, No. 3, Jul.-Sep. 2012, pp. 1-6.

Higashiki et al., "Nanoimprint Lithography for Semiconductor Devices and Future Patterning Innovation," Proc. of SPIE, vol. 7970, 2011, pp. 1-6.

S.V. Sreenivasan, "Nanoscale Manufacturing Enabled by Imprint Lithography," RS Bulletin, vol. 33, Sep. 2008, pp. 854-863.

Malloy et al., "Technology Review and Assessment of Nanoimprint Lithography for Semiconductor and Patterned Media Manufacturing," J. Micro/Nanolith. MEMS MOEMS, vol. 10, No. 3, Jul.-Sep. 2011, pp. 1-13.

Audet et al., "Analysis of Generalized Pattern Searches," Society for Industrial and Applied Mathematics, vol. 13, No. 3, pp. 889-903.

Kirkpatrick et al., "Optimization by Simulating Annealing," Science, vol. 220, No. 4598, May 13, 1983, pp. 671-680.

Bendsoe et al., "Topology Optimization—Theory, Methods and Applications," Springer-Verlag Berlin Heidelberg, 2003, pp. 1-370, see pp. 1-68.

Melanie Mitchell, "An Introduction to Genetic Algorithms," A Bradford Book The MIT Press, Cambridge, Massachusetts • London, England, 1999, pp. 1-158, see pp. 1-62.

Bertsimas et al., "Introduction to Linear Optimization," Massachusetts Institute of Technology, 1997, pp. 1-587, see pp. 41-79.

Cherala et al., "Active Wafer Shape Modulation Using a Multi-Actuator Chucking System," Proceedings—ASPE 2013 Spring Topical Meeting MIT Laboratory for Manufacturing and Productivity Annual Summit: Precision Control for Advanced Manufacturing Systems—Cambridge, MA, vol. 55, 2013, pp. 1-2.

* cited by examiner

TABLE 1 - PERFORMANCE OF TEMPLATE ACTUATION SCHEMES

| Initial Error<br>No. of Fields | 1ppm<br>X Mag | 1ppm<br>Y Mag | 10nm<br>X Trans | 10nm<br>Y Trans | 1μrad<br>Gamma | 1μrad<br>Theta |
|---|---|---|---|---|---|---|
| One (Cherala) | ~0* | ~0 | -** | -** | 0.2 | -** |
| Two (Yin) | 4 | 6.4 | 0.9 | 1.1 | 7.9 | 5.5 |

*Residual overlay error, in nm, post correction
**For single field overlay, these are be corrected using the stage actuators
Limiting force (compressive/tensile) = ±50N

FIG. 4

Translation in Y

Translation in X

Magnification in Y

Magnification in X

Rotation

Orthogonality k9 higher-order error (also referred to as trapezoidal error in X)

Exemplary higher-order residual errors after first-order error correction $k12$ higher-order error $k10$ higher-order error (also referred to as trapezoidal error in Y)

k19 higher-order error

TABLE 2 - PERFORMANCE OF CHERALA's and YIN's TEMPLATE ACTUATION SCHEMES vs THE DISCLOSED METHOD

| Initial Error | 1ppm | 1ppm | 10nm | 10nm | 1μrad | 1μrad |
|---|---|---|---|---|---|---|
| Method | X Mag | Y Mag | X Trans | Y Trans | Gamma | Theta |
| Cherala's (single field) | ~0* | ~0 | - | - | 0.2 | - |
| Yin's (dual field) | 4 | 6.4 | 0.9 | 1.1 | 7.9 | 5.5 |
| Topology and force location optimized template (dual field) | 1.9 | 2.5 | 2.7 | 2.3 | 3.2 | 2.9 |

*Residual overlay error, in nm, post correction
Limiting force (compressive/tensile) = ±50N
Tensile forces are allowed on the template

FIG. 21

TABLE 3 - PERFORMANCE OF WAFER THERMAL ACTUATION SCHEME

| Initial Error | 1ppm | 1ppm | 10nm | 10nm | 1μrad | 1μrad |
|---|---|---|---|---|---|---|
| No. of fields | X Mag | Y Mag | X Trans | Y Trans | Gamma | Theta |
| One | 0.4* | ~0.5 | 0.4 | 0.4 | 9 | 20 |
| Two | 0.4 | 0.4 | 0.4 | 0.2 | 11 | 29 |
| Four | 0.3 | 0.3 | 0.2 | 0.2 | 8.5 | 24 |

*Residual overlay error, in nm, post correction
Temperature range = 298±2K
6x8 grid of thermal actuators per field

FIG. 23

TABLE 4 - PERFORMANCE OF HYBRID ACTUATION SCHEME

| Initial Error | 1μrad | 1μrad |
|---|---|---|
| No. of fields | Gamma | Theta |
| Two# | 1.2* | 2 |
| Four** | 2.5 | 4.8 |

*Residual overlay error, in nm, post correction

Temperature range = 298±2K

12 thermal actuators per field, 32 template actuators

**24 thermal actuators per field, 32 template actuators

FIG. 24

TABLE 5 - INITIAL ERROR LIMITS FOR SUB-5NM FINAL OVERLAY USING HYBRID ACTUATION

| Initial Error Type / Overlay Type | X Mag | Y Mag | X Trans | Y Trans | Gamma | Theta |
|---|---|---|---|---|---|---|
| Dual-Field Overlay | ±0.5ppm | ±0.5ppm | ±5nm | ±5nm | ±0.5μrad | ±0.5μrad |
| Quad-Field Overlay | ±0.3ppm | ±0.3ppm | ±3nm | ±3nm | ±0.3μrad | ±0.3μrad |

FIG. 25

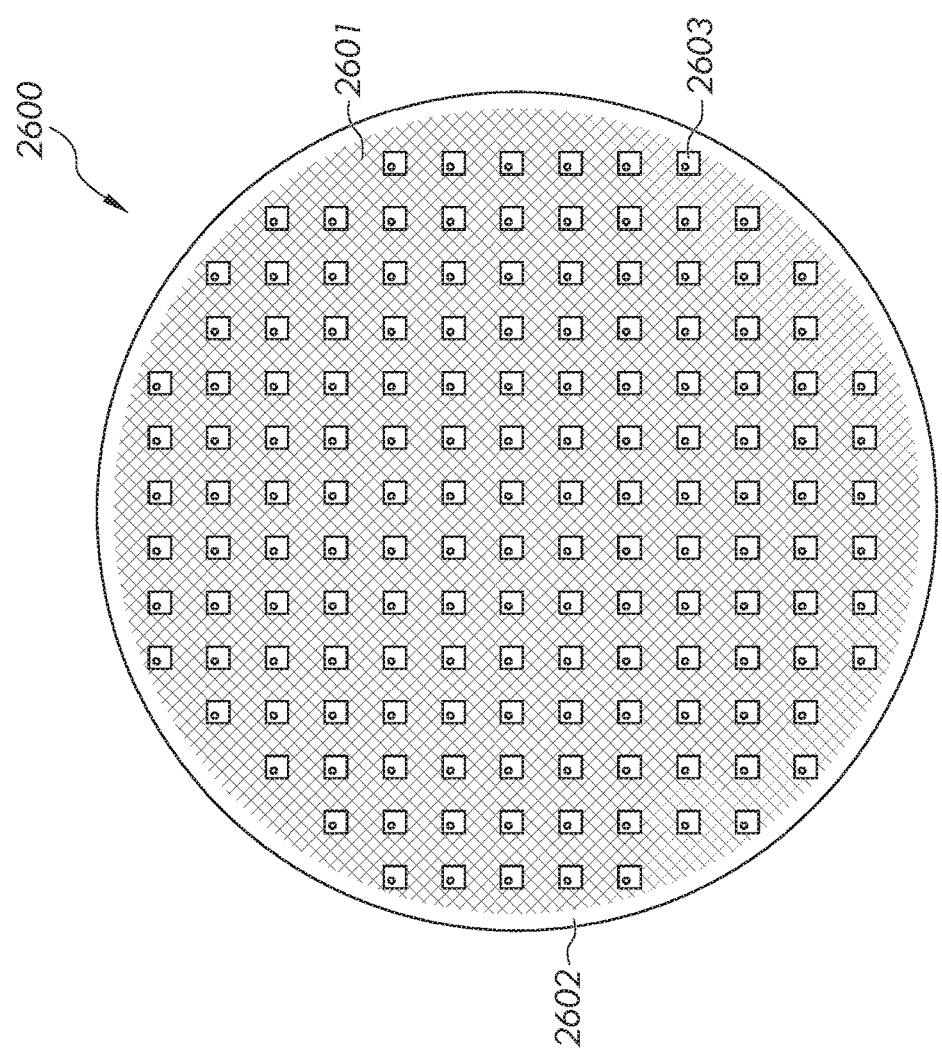

MULTI-FIELD OVERLAY CONTROL IN JET AND FLASH IMPRINT LITHOGRAPHY

GOVERNMENT INTERESTS

This invention was made with government support under Grant No. EEC1160494 awarded by the National Science Foundation. The U.S. government has certain rights in the invention.

TECHNICAL FIELD

The present invention relates generally to imprint lithography, and more particularly to multi-field overlay control (e.g., sub-5 nm) in Jet and Flash Imprint Lithography (J-FIL).

BACKGROUND

Imprint lithography is ideally suited for sub-25 nm patterning applications, with sub-3 nm large area patterning demonstrated in research. It offers significant advantages over other lithography techniques, such as self-aligned double patterning (SADP) and directed self-assembly (DSA) in terms of cost and pattern complexity. Recent advances in defect and overlay control in Jet and Flash Imprint Lithography (J-FIL), a specific form of imprint lithography, have set-up J-FIL as a close contender to SADP for manufacturing cost-sensitive devices, such as advanced memory.

One of the ongoing issues with imprint lithography is lower throughput in comparison to photolithography (at least for CMOS devices). Throughput is governed mainly by the area over which overlay can be controlled. J-FIL uses a field size of 26 mm×33 mm to enable mix and match with photolithography scanners. With current overlay techniques, J-FIL can pattern only a single such field in one imprint. This limits the throughput to about 20 wafers per hour.

For single field overlay in J-FIL, eight alignment correctibles are compensated as shown in FIGS. 1A-1H. FIG. 1A illustrates the alignment correctible of the translation in X. FIG. 1B illustrates the alignment correctible of the translation in Y. FIG. 1C illustrates the alignment correctible of rotation ($\theta$). FIG. 1D illustrates the alignment correctible of the magnification in X. FIG. 1E illustrates the alignment correctible of the magnification in Y. FIG. 1F illustrates the alignment correctible of the orthogonality ($\gamma$). FIG. 1G illustrates the alignment correctible of the trapezoid in X. FIG. 1H illustrates the alignment correctible of the trapezoid in Y.

Alignment values are obtained at each corner of a field using alignment marks, and are linearly transformed into the eight alignment correctibles (translation, rotation, etc.). The rigid body errors—translation in X, Y and rotation are reduced by the wafer stage. The five scale/shape errors (X Y magnification, orthogonality, and X Y trapezoid) are reduced using the Magnification/Scale Control System (MSCS). Additional details can be found in the work of Cherala et al., "Nanoscale Magnification and Shape Control System for Precision Overlay in Jet and Flash Imprint Lithography," IEEE/ASME Transactions on Mechatronics, Vol. 20, No. 1, February 2015, pp. 122-132, which is hereby incorporated by reference herein in its entirety.

Unlike photolithography, J-FIL is not fundamentally limited by field size. In fact, whole wafer high resolution imprinting has been previously demonstrated for bit patterned media. But for large area CMOS applications, large area imprinting capability is not enough. It is also necessary to have large area overlay reduction capability, which includes reducing both inter-field (or wafer level grid errors) as well as intra-field overlay errors. In other words, each field in a wafer might have intra-field overlay errors as well as wafer level grid errors. It is currently difficult to independently reduce all of these error components in a multi-field template thereby presenting a challenge to multi-field overlay limiting J-FIL's throughput for CMOS applications.

SUMMARY

In one embodiment of the present invention, a template comprises multiple lithography fields for imprinting at multiple locations simultaneously. The template further comprises multiple holes machined in unpatterned regions to reduce inter-field mechanical coupling and permit overlay control over the multiple lithography fields simultaneously.

In another embodiment of the present invention, a wafer system comprises a wafer comprising an array of fields, where two or more fields of the array of fields are lithography fields for imprinting at multiple locations simultaneously. The wafer system further comprises a grid of heating/cooling elements underneath each of the two or more lithography fields causing thermal expansion and contraction resulting in overlay reduction.

In a further embodiment of the present invention, a wafer system for photolithography, comprises a grid of heating/cooling elements underneath a field being lithographed causing thermal expansion and contraction resulting in reduction of the following overlay errors: trapezoidal errors in X and Y, orthogonality errors and higher order errors.

In another embodiment of the present invention, a system comprises a template comprising multiple lithography fields for imprinting at multiple locations simultaneously. The template further comprises multiple holes machined in unpatterned regions to reduce inter-field mechanical coupling and permit overlay control over the multiple lithography fields simultaneously. The system further comprises a wafer system comprising a wafer comprising an array of fields, where two or more fields of the array of fields are lithography fields for imprinting at multiple locations simultaneously. The wafer system further comprises a grid of heating/cooling elements underneath each of the two or more lithography fields causing thermal expansion and contraction resulting in overlay control. The overlay control via the multiple holes and the grid of heating/cooling elements control overlay in a coordinated manner.

In a further embodiment of the present invention, a computer program product for locating optimal locations of holes in a template, the computer program product comprising a computer readable storage medium having program code embodied therewith, the program code comprises the programming instructions for receiving an initial population of optimization parameters. The program code further comprises the programming instructions for calculating a compliance matrix of the template for a current set of optimization parameters. The program code additionally comprises the programming instructions for determining a residual error for each of the error cases using the compliance matrix. Furthermore, the program code comprises the programming instructions for identifying a maximum residual error out of the determined residual errors. Additionally, the program code comprises the programming instructions for selecting the current set of optimization parameters to be utilized to place the holes in the template in response to the maximum residual error converging or a number of iterations exceeding a threshold value.

Other forms of the embodiment of the computer program product described above are in a method and in a system.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIG. 4 is a table, Table 1, showing the results of a computer simulation for evaluating the performance of Yin's method in accordance with an embodiment of the present invention;

FIG. 21 is a table, Table 2, showing that the template performs significantly better than Yin's uniformly solid template for dual-field overlay in accordance with an embodiment of the present invention;

FIG. 23 is a table, Table 3, showing the results of a computer simulation for evaluating the performance of the wafer thermal actuation method in accordance with an embodiment of the present invention;

FIG. 24 is a table, Table 4, showing the simulated performance of the hybrid actuation scheme for gamma and theta errors for dual and quad field cases in accordance with an embodiment of the present invention;

FIG. 25 is a table, Table 5, showing the initial error limits for sub-5 nm final overlay using hybrid actuation in accordance with an embodiment of the present invention; and FIG. 26 illustrates an exemplary chuck using small vacuum pockets to prevent wafer bowing due to gas backpressure in accordance with an embodiment of the present invention.

DETAILED DESCRIPTION

While the following discusses the present invention in connection with improving throughput in jet and flash imprint lithography (J-FIL), the principles of the present invention may be used in photolithography scanners for improving shot image placement. A person of ordinary skill in the art would be capable of applying the principles of the present invention to such implementations. Further, embodiments applying the principles of the present invention to such implementations would fall within the scope of the present invention.

As discussed in the Background section, each field in a wafer might have intra-field overlay errors as well as wafer level grid errors. It is currently difficult to independently reduce all of these error components in a multi-field template thereby presenting a challenge to multi-field overlay.

The principles of the present invention provide a technique for multi-field sub-5 nm overlay, which could substantially improve J-FIL's throughput for CMOS applications. While the principles of the present invention may apply to whole wafer overlay, the description of the present invention focuses on dual-field and quad-field overlay. An exemplary dual-field configuration is shown in FIG. 2.

Figure 1A:
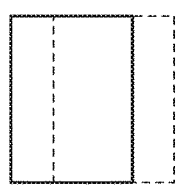
FIG. 1A illustrates the alignment correctible of the translation in X.
Figure 1B:
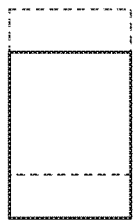
FIG. 1B illustrates the alignment correctible of the translation in Y.
Figure 1C:
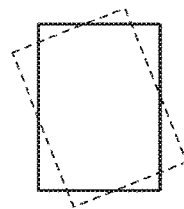
FIG. 1C illustrates the alignment correctible of rotation (θ)
Figure 1D:
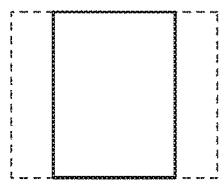
FIG. 1D illustrates the alignment correctible of the magnification in X.
Figure 1E:
FIG. 1E illustrates the alignment correctible of the magnification in Y.
Figure 1F:
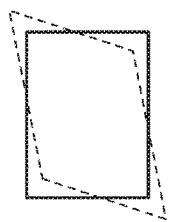
FIG. 1F illustrates the alignment correctible of the orthogonality (γ)
Figure 1G:
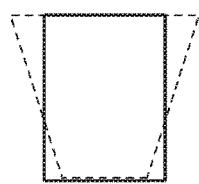
FIG. 1G illustrates the alignment correctible of the trapezoid in X.
Figure 1H:
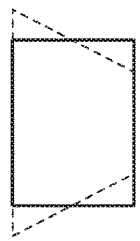
FIG. 1H illustrates the alignment correctible of the trapezoid in Y.
Figure 2:
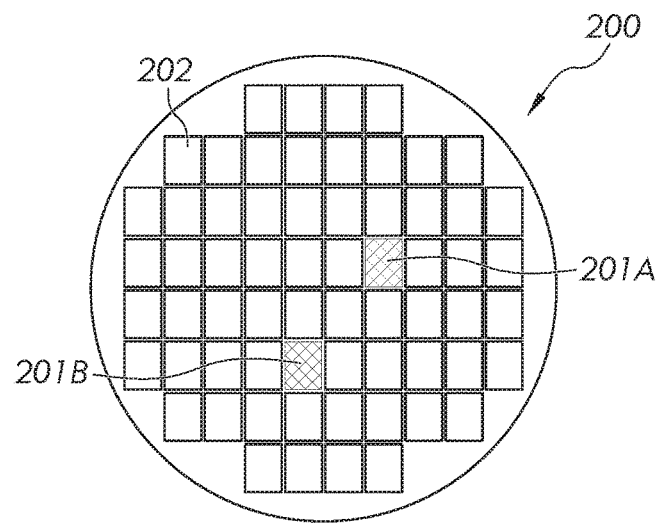
FIG. 2 illustrates a pair of dual-imprinted fields in an array of fields on a 300 mm wafer in accordance with an embodiment of the present invention.

FIG. 2 illustrates a pair of dual-imprinted fields 201A-201B in an array of fields 202 on a 300 nm wafer 200 in accordance with an embodiment of the present invention. Fields 201A-201B may collectively or individually be referred to as fields 201 or field 201, respectively. In one embodiment, fields 202, such as fields 201, are lithography fields for imprinting at multiple locations simultaneously. In such a configuration, close to two-thirds of the wafer fields 202 can be imprinted two at a time, giving an overall throughput gain of about 1.5× thereby resulting in lowering the cost for lithography.

Dual-field overlay using template actuation has been previously proposed before by B. A. Yin, "Dual Field Nano Precision Overlay," Master's Thesis, 2010, pp. 1-40, which is hereby incorporated herein by reference in its entirety. Yin's method is an extension of the single field overlay technique of Cherala for a dual-field template (discussed below). In particular, as in Cherala's technique, correction forces 301A-301B are applied at the edges of the template 302 and errors are measured using alignment marks located at the corners of each field as shown in FIG. 3 in accordance with an embodiment of the present invention.

Figure 3:
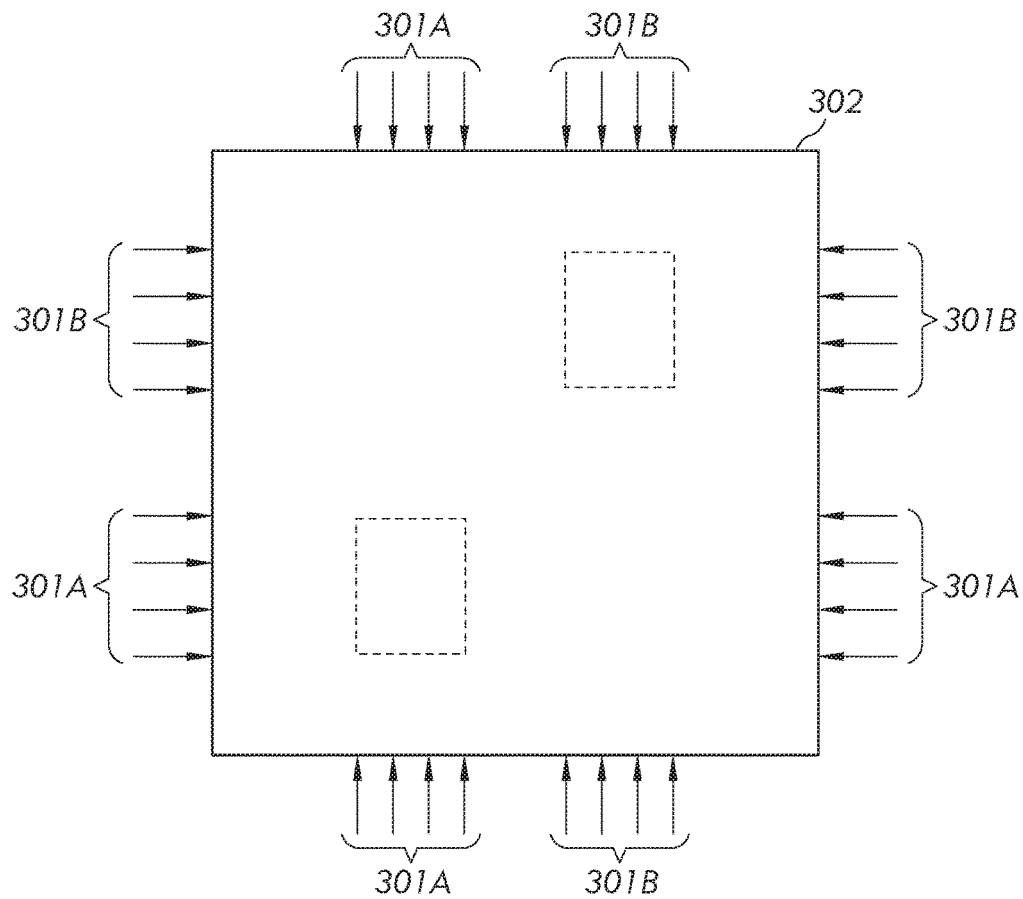
FIG. 3 illustrates applying correction forces at the edges of the template and measuring errors using alignment marks located at the corners of each field in accordance with an embodiment of the present invention.

Referring to FIG. 3, FIG. 3 illustrates a standard 17025 template 302 with corresponding dual-fields 201A-201B. The two fields 201A-201B shown are in Yin's dual field configuration. The force application locations are shown by the arrows at the edges of template 302.

International Technology Roadmap for Semiconductors (ITRS) projects that for the year 2017 DRAM overlay requirements would be 4.0 nm 3-sigma. Yin's method, while straightforward, is not sufficient for sub-5 nm dual-field overlay. Table 1, as shown in FIG. 4, shows the results of a computer simulation for evaluating the performance of Yin's method in accordance with an embodiment of the present invention. As illustrated in FIG. 4, it can be seen that the final overlay for the considered error cases is not below 5 nm for all error cases.

It is noted that tensile forces are allowed on the template in the simulation. However, this is not possible on a real template since it is difficult to build a Magnification/Scale Control System (MSCS) which can push as well as pull the template. The problem can be solved by deliberately introducing a fixed positive magnification type error while patterning the template (the positive magnification error emulates the effect of tensile forces).

It is further noted that the dual-field configuration used herein is the same as the exemplary dual-field previously discussed. The quad-field configuration has four fields placed in the four corners of the rectangle defined by the two fields of the dual-field configuration as shown in FIG. 5C.

Figure 5C:
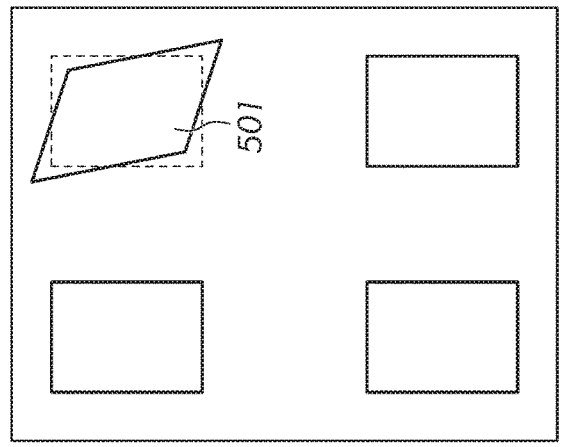
FIG. 5C illustrates the alignment correctible of the orthogonality (γ) for the quad-field imprint applied to a field in accordance with an embodiment of the present invention.
Figure 5B:
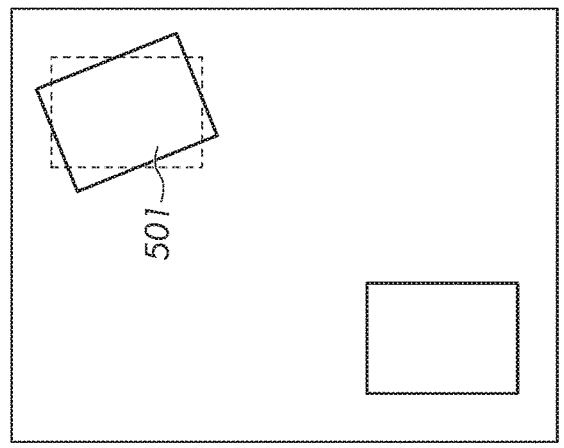
FIG. 5B illustrates the alignment correctible of the rotation for the dual-field imprint applied to a field in accordance with an embodiment of the present invention.
Figure 5A:
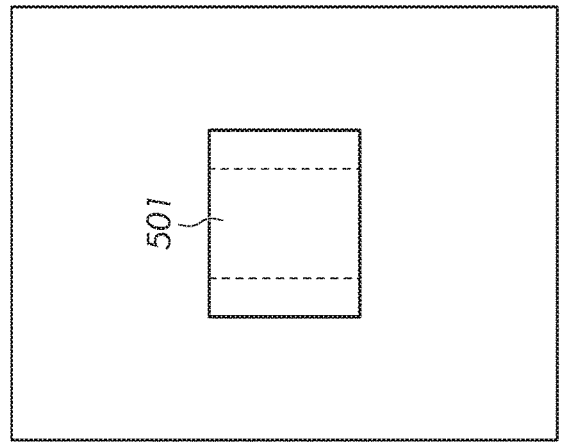
FIG. 5A illustrates the alignment correctible of the magnification in X for a single field imprint applied to a field in accordance with an embodiment of the present invention.

Referring now to FIGS. 5A-5C, FIG. 5A illustrates the alignment correctible of the magnification in X for a single field imprint applied to field 501 in accordance with an embodiment of the present invention. FIG. 5B illustrates the alignment correctible of the rotation for the dual-field imprint applied to field 501 in accordance with an embodiment of the present invention. FIG. 5C illustrates the alignment correctible of the orthogonality (γ) for the quad-field imprint applied to field 501 in accordance with an embodiment of the present invention.

Figure 15:
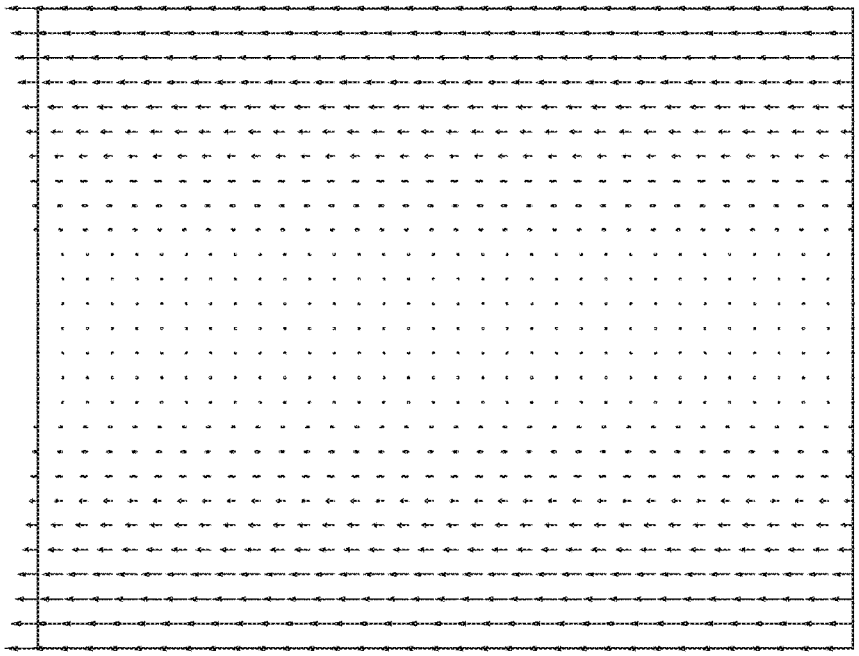
Figure 14:
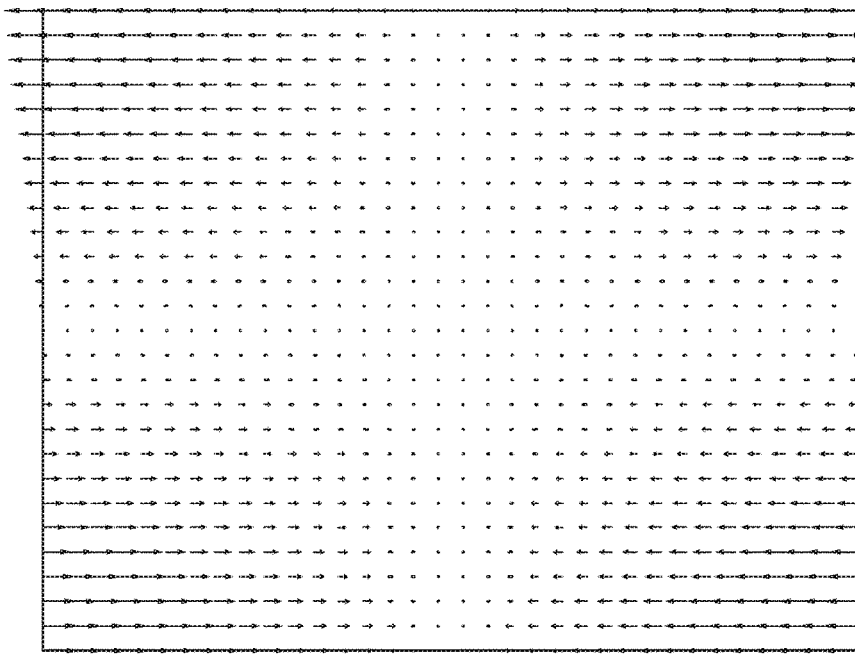

In one embodiment, for all the template configurations, it is assumed that the fields (patterning areas) are on a raised region and all of the non-field areas are recessed. The details of such recesses are provided in U.S. Pat. No. 7,727,453 which is hereby incorporated herein by reference in its entirety. In particular, in U.S. Pat. No. 7,727,453, the gap h2 (see FIG. 15) is defined between the recessed region and the substrate, while the gap h1 (see FIG. 15) is defined between the field (patterning region) and the substrate; and h1 is substantially lower than h2. This enables capillary based inhibition of curable liquid thereby confining the curable liquid to remain substantially superimposed with the patterning area. In the present invention, this precise liquid confinement allows for patterning of multiple separated fields—shown in FIGS. 5B-5C—and then allows subsequent patterning of unpatterned fields without interference with the previously patterned fields.

In addition to overlay error reduction over multiple fields, the present invention can also use the topology optimization techniques, the template force actuation, and wafer thermal actuation scheme to improve overlay errors, including higher order overlay reduction in a single field and over multiple fields. The idea of higher order reduction over a single field can also be applied to photolithography using one or more of the three features listed below.

Figure 7:
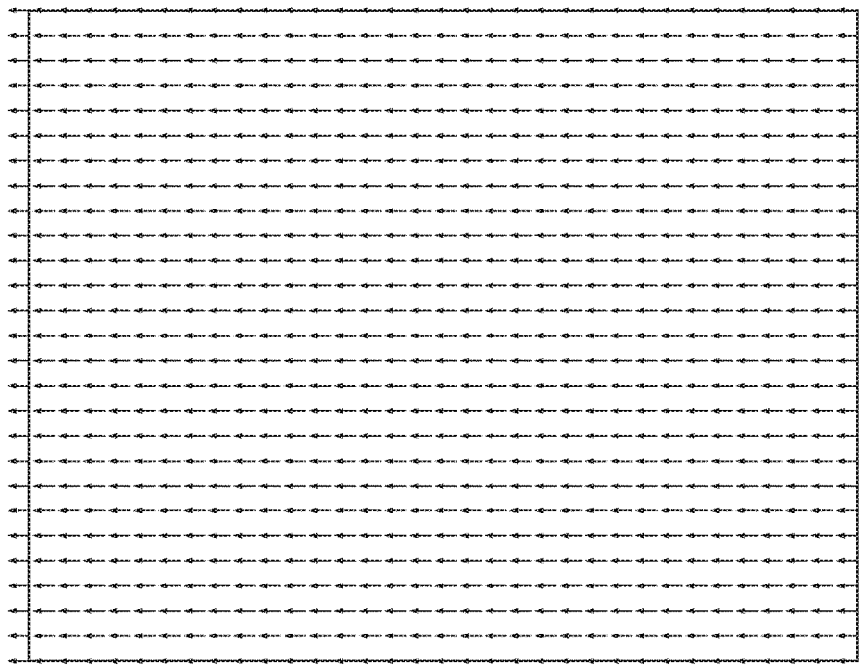
FIGS. 6 and 7 illustrate that the terms k1 and k2 represent the first order errors corresponding to the translation in X and Y, respectively, in accordance with an embodiment of the present invention.
Figure 6:
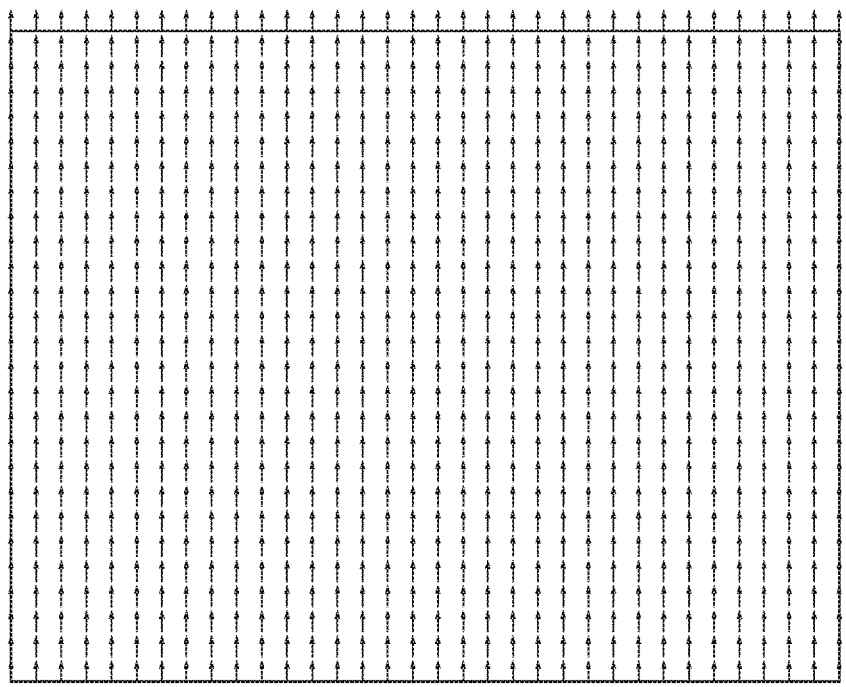
Figure 9:
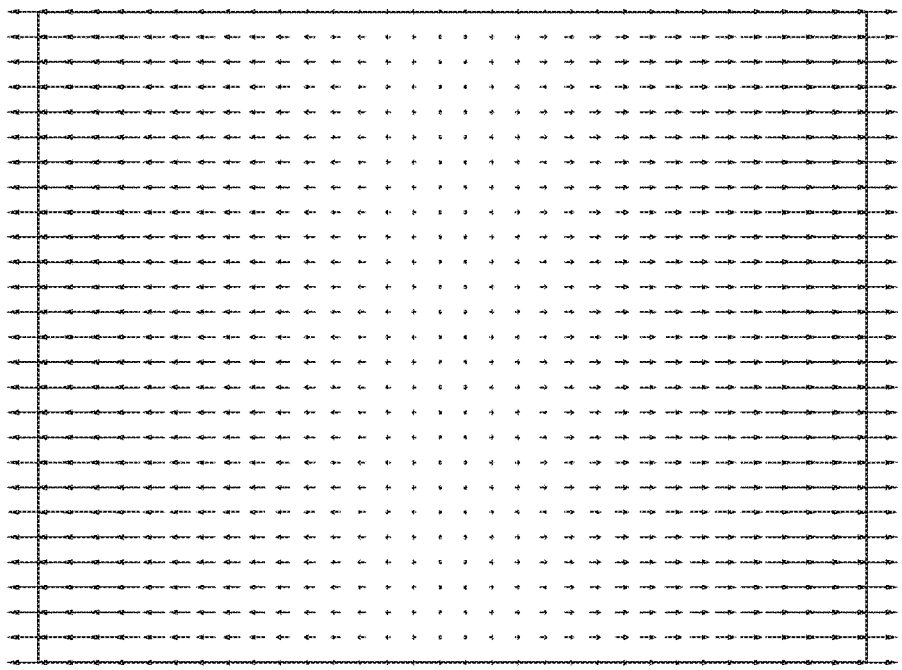
FIGS. 8 and 9 illustrate that the terms k3 and k4 represent the first order errors corresponding to the magnification in X and Y, respectively, in accordance with an embodiment of the present invention.
Figure 8:
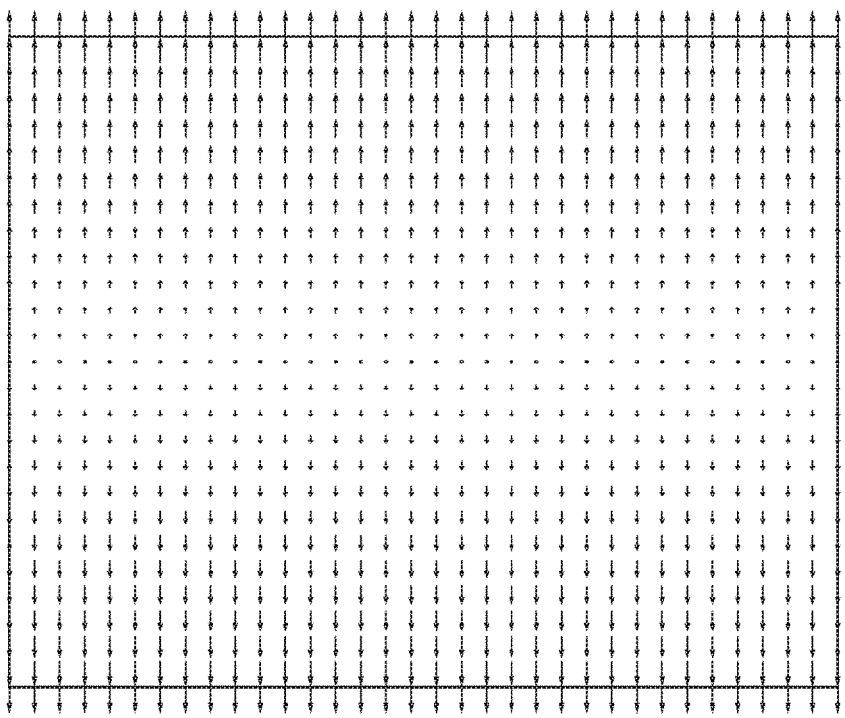
Figure 11:
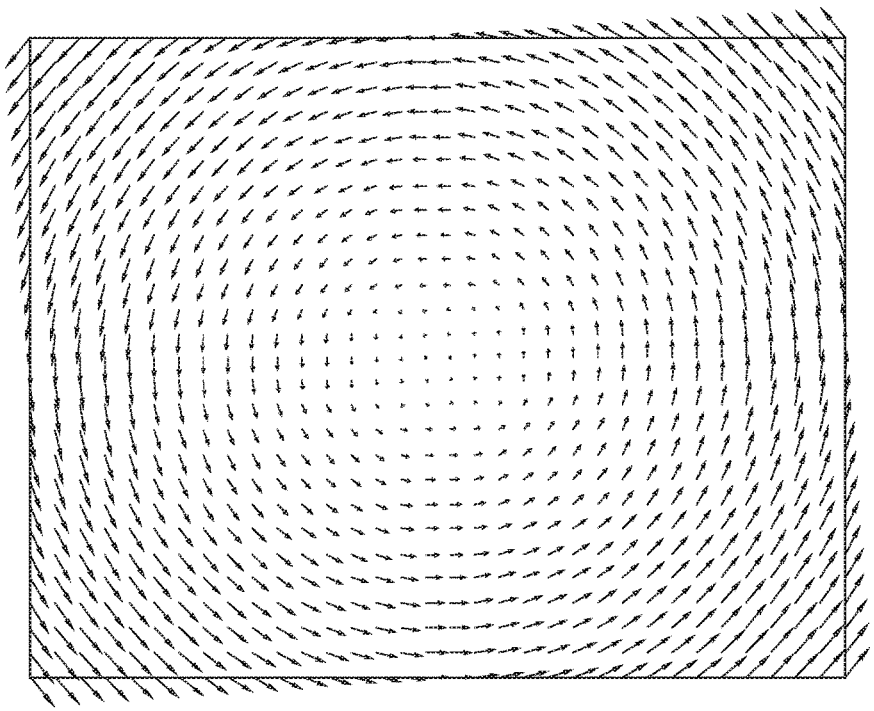
FIGS. 10 and 11 illustrate that the terms k5 and k6 represent the first order errors corresponding to orthogonality and rotation, respectively, in accordance with an embodiment of the present invention.
Figure 10:
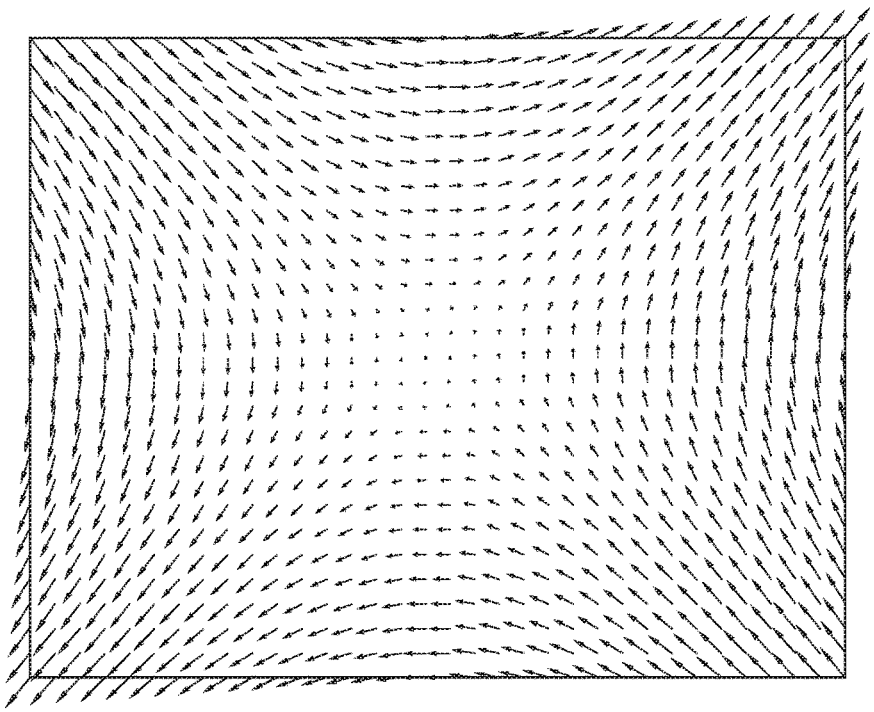
Figure 13:
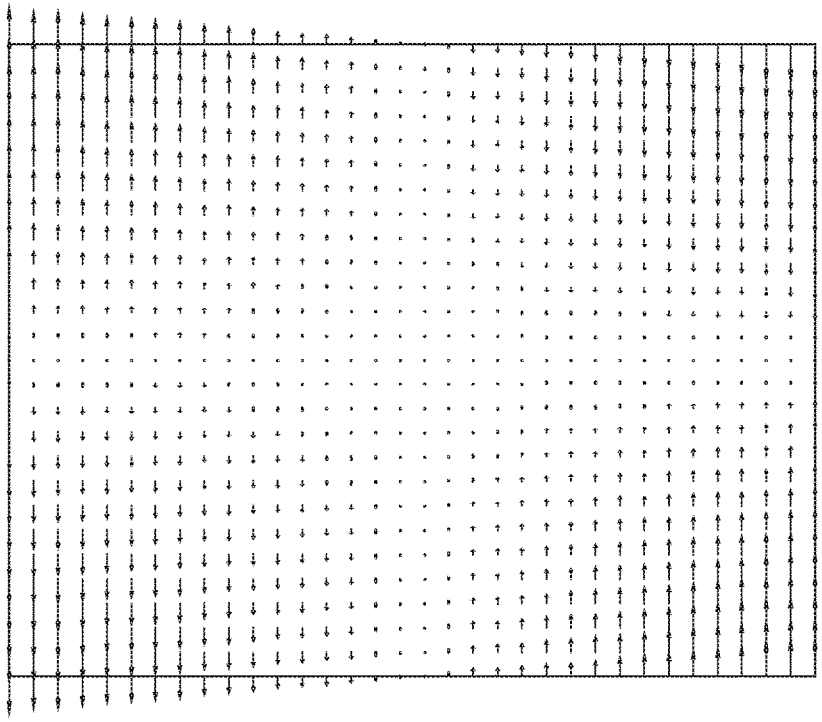
FIGS. 13-16 show some exemplary higher-order error terms in accordance with an embodiment of the present invention.

The general overlay state of a field can be described using the following set of equations:

$$dx = k1 + k3^*x + k5^*y + k7^*x^2 + k9^*xy + k11^*y^2 + k13^*x^3 + k15^*x^2y + k17^*xy^2 + k19^*y^3 + k21^*x^4 + k23^*x^3y + \ldots$$

$$dy = k2 + k4^*y + k6^*x + k8^*y^2 + k10^*xy + k12^*x^2 + k14^*y^3 + k16^*y^2x + k18^*yx^2 + k20^*x^3 + k22^*y^4 + k24^*y^3x + \ldots$$

where, dx and dy represent the orthogonal deformation state at any point (x,y) on the field. The coefficients in the expansion represent specific deformation components—terms k1 to k6 represent first order errors. k1 and k2 correspond to translation in X and Y as shown in FIGS. 6 and 7, respectively, in accordance with an embodiment of the present invention. k3 and k4 correspond to magnification in X and Y as shown in FIGS. 8 and 9, respectively, in accordance with an embodiment of the present invention. k5 and k6 are equivalent to orthogonality and rotation as shown in FIGS. 10 and 11, respectively, in accordance with an embodiment of the present invention.

Figure 12:
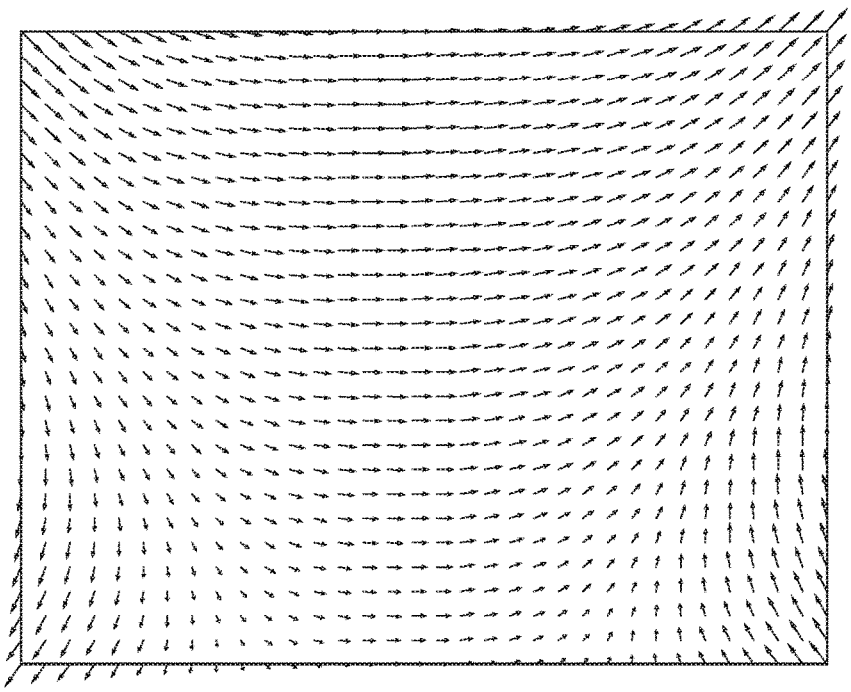
FIG. 12 shows an exemplary error state after first-order errors have been reduced in accordance with an embodiment of the present invention.

The first order terms generally constitute the bulk of the overlay errors. However, for state-of-the-art overlay control higher-order errors need to be corrected as well. FIG. 12 shows an exemplary error state after first-order errors have been reduced in accordance with an embodiment of the present invention. FIGS. 13-16 show some exemplary higher-order error terms in accordance with an embodiment of the present invention.

In one embodiment, the higher order overlay reduction is further enhanced by co-optimizing the capabilities of one or more of the following features:

Correcting overlay from the wafer side using wafer-thermal actuators,

Optimizing the topology of the template with selectively machined locations, and Combining wafer-thermal and template actuation techniques to achieve significantly improved single and multi-field overlay performance.

In a uniformly solid template, as used in Yin's method, there is a large amount of mechanical coupling between the two fields. Therefore, the same method which can produce sub-1 nm overlay for a single field cannot produce similar overlay for the dual-field case since error reduction in one field induces errors in the other field. The inter-field coupling can, however, be reduced by machining holes 1701 at carefully chosen locations on template 302 as shown in FIG.

17 in accordance with an embodiment of the present invention. Additionally, the locations of template correction forces can be optimized to further improve performance using one of the following methods which are incorporated by reference herein in its entirety: (1) Bendsoe et al., "Topology Optimization—Theory, Methods and Applications," Springer-Verlag Berlin Heidelberg, 2003; (2) Tai et al., "Multiobjective Topology Optimization using a Genetic Algorithm and a Morphological Representation of Geometry," 6th World Congress of Structural and Multidisciplinary Optimization, Rio de Janeiro, 30 May-3 Jun. 2005, Brazil; and (3) Jakiela et al., "Continuum Structural Topology Design with Genetic Algorithms," Comput. Methods Appl. Mech. Engrg., Vol. 186, 2000, pp. 339-356.

As discussed above, the inter-field coupling can be reduced by machining holes 1701 at carefully chosen locations on template 302 thereby permitting overlay control over multiple lithography fields 201 simultaneously (e.g., reducing translation errors in X and Y, reducing magnification errors in X and Y, reducing orthogonality errors, reducing angular errors and reducing higher order errors in overlay). It is not obvious as to where these holes 1701 should be made in template 302. As a result, a topology optimization algorithm (discussed below) is used for locating the optimal locations of holes 1701. In particular, the topology optimization algorithm optimizes the material layout within a given design space, for a given set of loads and boundary conditions, such that the resulting layout meets a prescribed set of performance targets.

In one embodiment, the topology optimization algorithm may be implemented via a computing system as discussed below.

Figure 17:
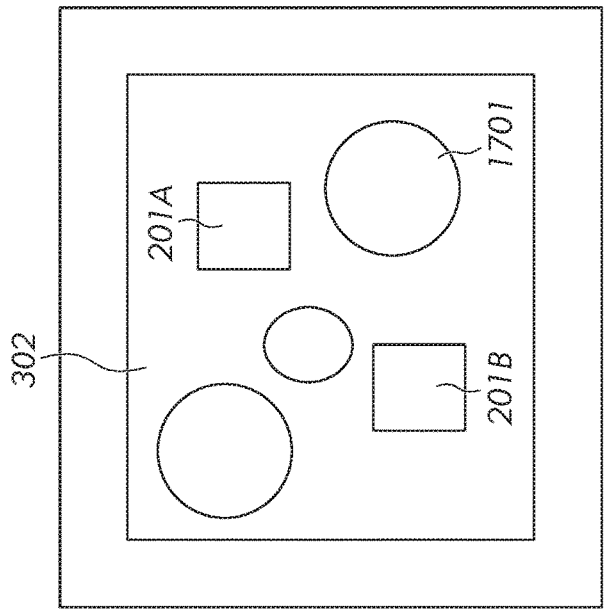
FIG. 17 illustrates reducing the inter-field coupling by machining holes at carefully chosen locations on the template in accordance with an embodiment of the present invention.
Figure 16:
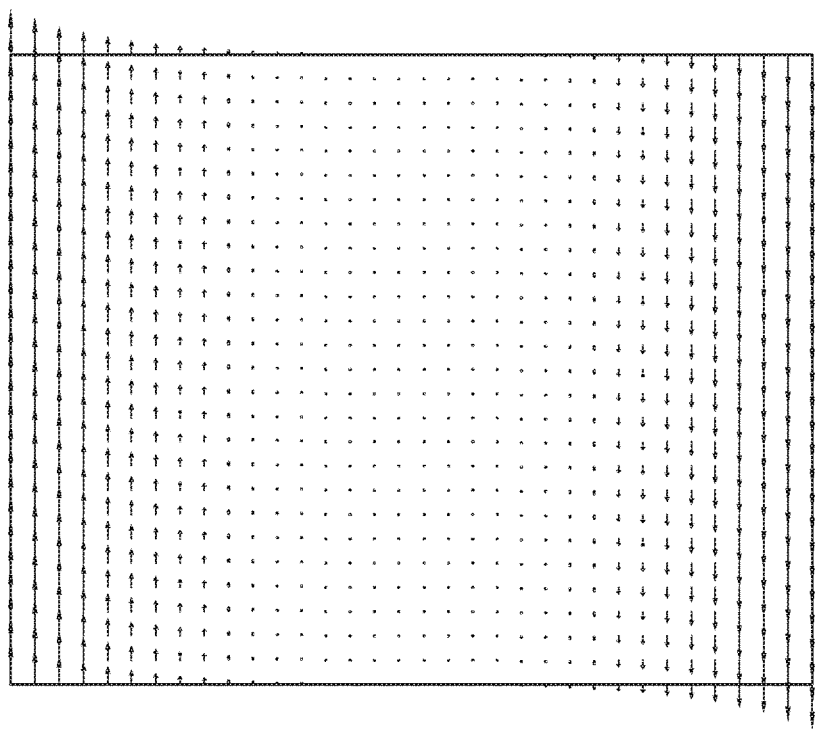
Figure 18:
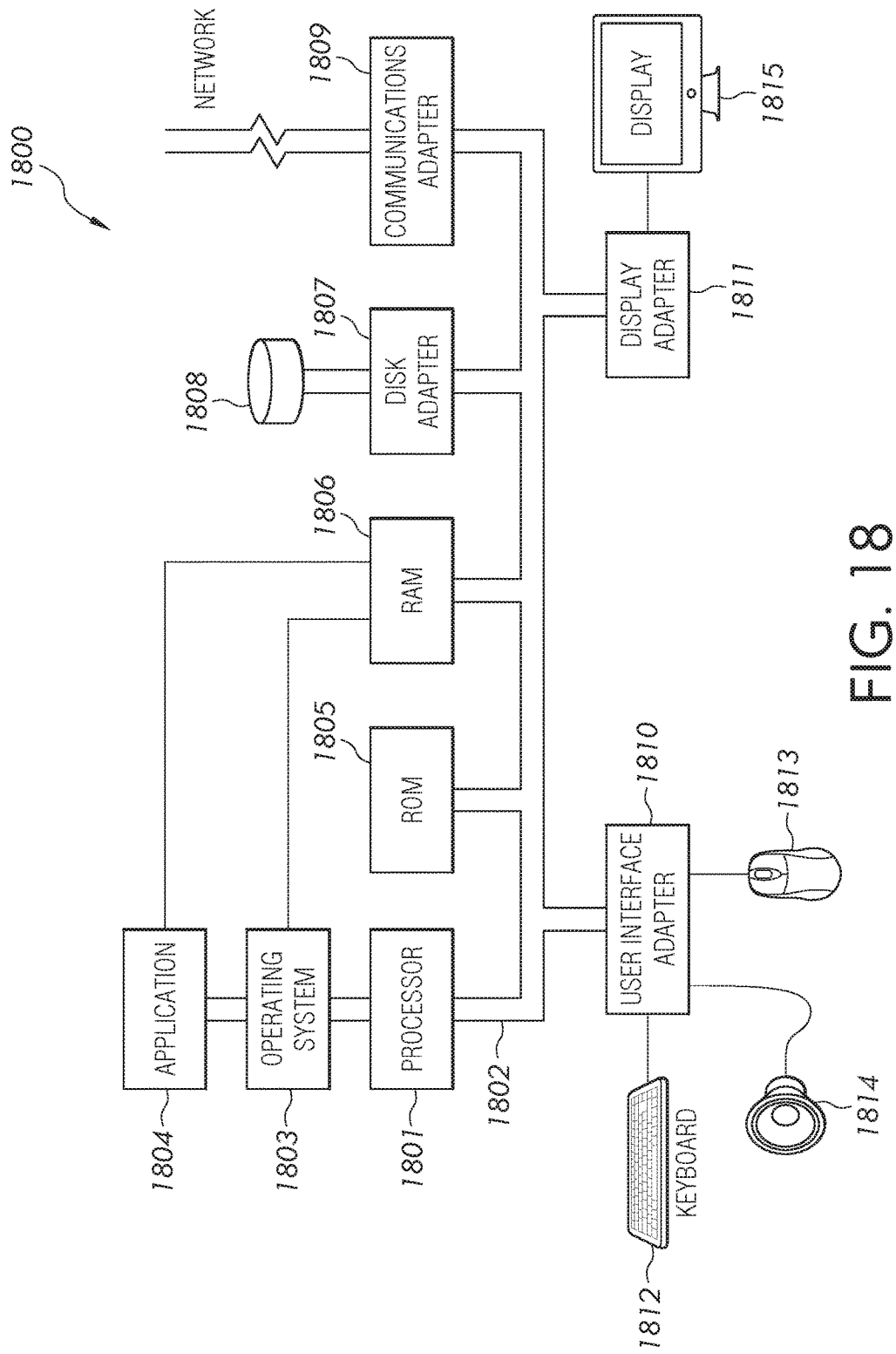
FIG. 18 illustrates an embodiment of the present invention of the hardware configuration of a computing device which is representative of a hardware environment for practicing the present invention.

Referring now to the Figures in detail, FIG. 18 illustrates an embodiment of the present invention of the hardware configuration of a computing device 1800 which is representative of a hardware environment for practicing the present invention. Computing device 1800 may be any type of computing device (e.g., portable computing unit, Personal Digital Assistant (PDA), smartphone, laptop computer, mobile phone, navigation device, game console, desktop computer system, workstation, Internet appliance and the like) configured with the capability of locating the optimal locations of holes 1701 (FIG. 17). Referring to FIG. 18, computing device 1800 may have a processor 1801 coupled to various other components by system bus 1802. An operating system 1803 may run on processor 1801 and provide control and coordinate the functions of the various components of FIG. 18. An application 1804 in accordance with the principles of the present invention may run in conjunction with operating system 1803 and provide calls to operating system 1803 where the calls implement the various functions or services to be performed by application 1804. Application 1804 may include, for example, an application for locating the optimal locations of holes 1701 as discussed further below.

Referring again to FIG. 18, read-only memory ("ROM") 1805 may be coupled to system bus 1802 and include a basic input/output system ("BIOS") that controls certain basic functions of computing device 1800. Random access memory ("RAM") 1806 and disk adapter 1807 may also be coupled to system bus 1802. It should be noted that software components including operating system 1803 and application 1804 may be loaded into RAM 1806, which may be computing device's 1800 main memory for execution. Disk adapter 1807 may be an integrated drive electronics ("IDE") adapter that communicates with a disk unit 1808, e.g., disk drive. It is noted that the program for locating the optimal locations of holes 1701 may reside in disk unit 1808 or in application 1804.

Computing device 1800 may further include a communications adapter 1809 coupled to bus 1802. Communications adapter 1809 may interconnect bus 1802 with an outside network thereby allowing computing device 1800 to communicate with other devices.

I/O devices may also be connected to computing device 1800 via a user interface adapter 1810 and a display adapter 1811. Keyboard 1812, mouse 1813 and speaker 1814 may all be interconnected to bus 1802 through user interface adapter 1810. A display monitor 1815 may be connected to system bus 1802 by display adapter 1811. In this manner, a user is capable of inputting to computing device 1800 through keyboard 1812 or mouse 1813 and receiving output from computing device 1800 via display 1815 or speaker 1814. Other input mechanisms may be used to input data to computing device 1800 that are not shown in FIG. 18, such as display 1815 having touch-screen capability and keyboard 1812 being a virtual keyboard. Computing device 1800 of FIG. 18 is not to be limited in scope to the elements depicted in FIG. 18 and may include fewer or additional elements than depicted in FIG. 18.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As discussed above, a topology optimization algorithm is used for locating the optimal locations of holes 1701 as discussed below in connection with FIG. 19.

Figure 19:
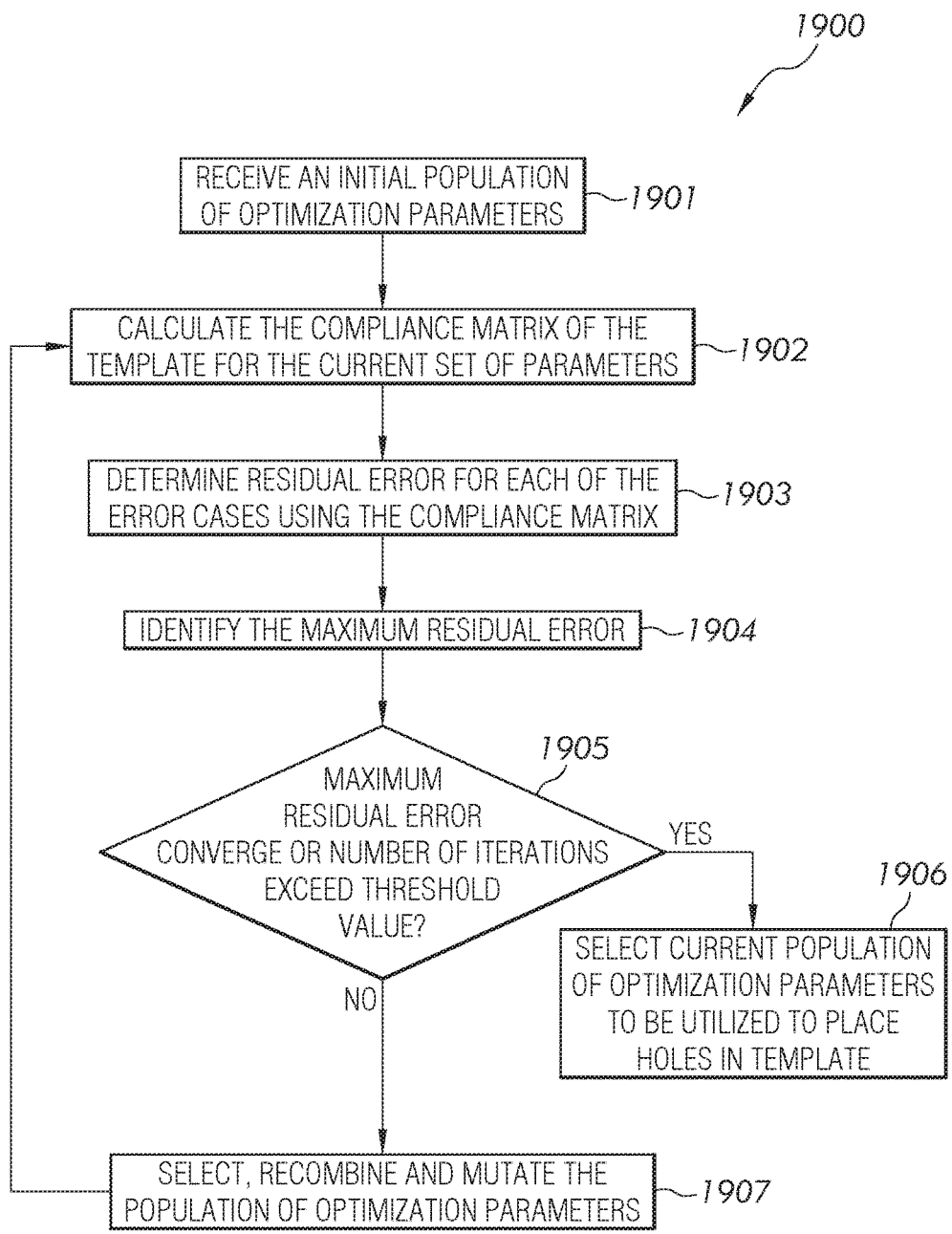
FIG. 19 is a flowchart of a method for locating the optimal location of the holes in a template in accordance with an embodiment of the present invention.

FIG. 19 is a flowchart of a method 1900 for locating the optimal location of holes 1701 (FIG. 17) in a template 302 (FIG. 17) in accordance with an embodiment of the present invention.

In particular, the topology optimization algorithm optimizes the material layout within a given design space, for a given set of loads and boundary conditions, such that the resulting layout meets a prescribed set of performance targets.

Referring to FIG. 19, in conjunction with FIGS. 3-4, 5A-5C and 17-18, in step 1901, computing device 1800 receives an initial population of optimization parameters, such as the template density matrix and the correction force locations.

In step 1902, computing device 1800 calculates the compliance matrix of template 302 for the current set of parameters.

With respect to the compliance matrix for template actuation and residual error calculation, the general deformation state of the template due to forces applied at the sides can be found using the Navier-Cauchy equations:

$$\frac{1}{1-2v}\nabla(\nabla \cdot \bar{u}) + \nabla^2 \bar{u} + \frac{F}{\mu} = 0$$

where, $\bar{u}$ is the deformation field, F is the body force, v is Poisson's ratio and $\mu$ is the shear modulus. Since this is linear in $\bar{u}$, template deformation at the grid points can be described more simply by the following equation:

$$C^*\{F_{template}\} = \{\delta\}$$

where, $\{F_{template}\}$ is the vector of forces applied at the sides of the template, $\{\delta\}$ is the vector of template deformation at the grid points and C is the template compliance matrix. Three force components of $\{F_{template}\}$ must be used for maintaining static equilibrium of the template. These three will be linearly dependent on the remaining force components. $\{F_{template}\}$ can be expressed in terms of the independent force combinations as follows:

$$\{F_{template}\}_{noFx1} = \{FN_{template}\}_{noFx(noF-3)} \alpha_{noFx1}$$

where, noF is the total number of template correction forces and, $\alpha_{noFx1}$ is the vector of degrees of activation of the basis set of forces $\{FN_{template}\}_{noFx(noF-3)}$. The template correction equation now becomes:

$$\{C^*\{FN_{template}\}\}^*\alpha = \{\delta\}$$

$C^*\{FN_{template}\}$ (referred to herein as $C_{template}$) can be found by solving the general plate deformation equation for unit activations of the basis force combinations and assembling the resulting deformation vectors into a matrix. $\{F_{template}\}$ required for optimally correcting $\{\delta\}$ is found by solving an optimization problem for minimizing the maximum residual overlay error:

min w
where, $$w \geq \{\delta\} - C_{template}^* \alpha$$

$$w \geq C_{template}^* \alpha - \{\delta\}$$

$$-F_L \leq \{FN_{template}\}^* \alpha \leq F_L$$

where, w is the maximum residual overlay error in X and Y, and $F_L$ is the limiting compressive/tensile force. This is a linear programming problem and can be solved using commonly available mathematical programming software.

With respect to the compliance matrix for wafer thermal actuation and residual error calculation, wafer thermal correction can also be described by a linear equation:

$$C_{thermal}^* \{T\} = \{\delta\}$$

where, $\{T\}$ is the set of temperatures applied at the thermal actuators (relative to the reference temperature of 298K), $\{\delta\}$ is the vector of wafer deformation at the grid points and $C_{thermal}$ is the thermal compliance matrix. Like template actuation, $\{T\}$ required for optimally correcting $\{\delta\}$ is found by solving an optimization problem for minimizing the maximum residual overlay error:

min w
where, $$w \geq \{\delta\} - C_{thermal}^* \{T\}$$

$$w \geq C_{thermal}^* \{T\} - \{\delta\}$$

$$-T_L \leq \{T\} \leq T_L$$

In step 1903, computing device 1800 determines the residual error for each of the error cases (e.g., translation errors in X and Y, magnification errors in X and Y, orthogonality errors, angular errors, higher order errors in overlay) using the compliance matrix.

In step 1904, computing device 1800 identifies the maximum residual error out of the determined residual errors.

In step 1905, a determination is made by computing device 1800 as to whether the maximum residual error converges or if the number of iterations exceeds a threshold value, where such a threshold value could be user-selected. With respect to the maximum residual error converging, there are a variety of criterions that could be used to define convergence. One common criterion is the fractional change in the objective function. When the fractional change goes below a preset value, convergence is said to be achieved.

If the maximum residual error has converged or if the number of iterations has exceeded a threshold value, then the population of optimization parameters, such as the template density matrix and the correction force locations, has been optimized. As a result, computing device 1800, in step 1906, selects such population of optimization parameters to be utilized to place holes 1701 in template 302.

If, however, the maximum residual error has not converged and the number of iterations has not exceeded a threshold value, then, in step 1907, computing device 1800 selects, recombines and mutates the population of optimization parameters, such as the template density matrix and the correction force locations. The compliance matrix of template 302 is then recalculated for the new set of parameters.

In one embodiment, the algorithm of method 1900 is built around a plane stress finite element analysis of template 302. Template 302 is first meshed to calculate the displacements associated with boundary forces. To represent an arbitrary topology, a density factor "ρ" is associated with each meshed element. ρ can either be one or zero (to avoid computational problems a small number is usually used instead of zero), corresponding to the presence or absence of material at that element. Four geometrical parameters are chosen to locate the force application points around template 302. Given the meshed state, the ρ matrix and the correction force locations (and magnitudes), a finite element solution can be obtained. The template compliance matrix ($C_{template}$) can be obtained by finding finite element solutions for all the basis force combinations. The maximum residual overlay error can then be obtained as discussed above. This is the output of the objective function. In one embodiment, the optimization procedure used to minimize this output is a genetic algorithm (referred to as GA). The reason for choosing GA is that it requires only first order function calculations, and is well suited for the objective function here, which is neither continuous nor differentiable. In one embodiment, Matlab®'s GA toolbox is used for the actual implementation.

Figure 20:
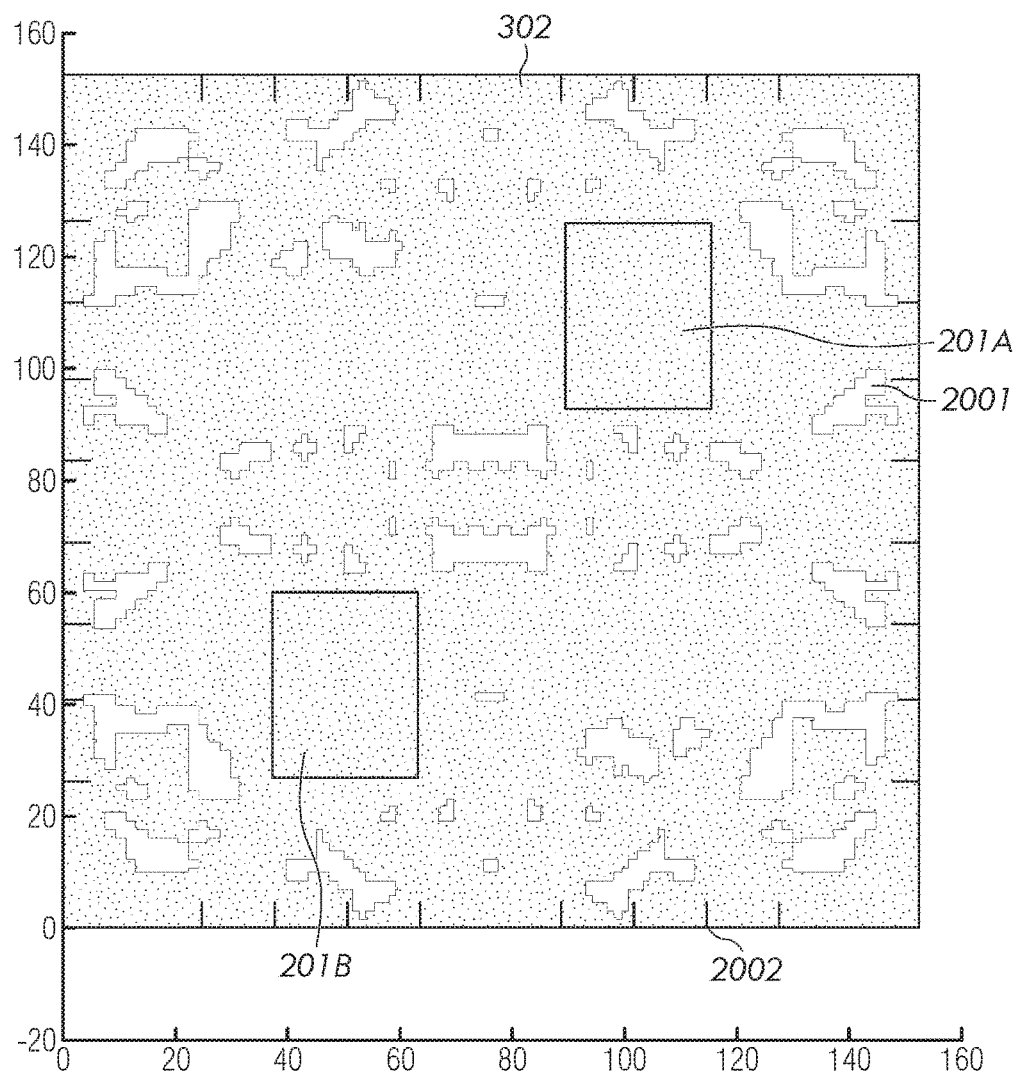
FIG. 20 illustrates the topology and force location optimized template geometry in accordance with an embodiment of the present invention.

FIG. 20 illustrates the topology and force location optimized template geometry in accordance with an embodiment of the present invention. Referring to FIG. 20, regions 2001 are where template 302 needs to be machined out. Regions 201A-201B indicate the locations of the two fields. Furthermore, marks 2002 are force application points.

As illustrated in FIG. 20, in one embodiment, only a quarter of template 302 is used for topology optimization. This is done in order to reduce the amount of computation required and impart the optimized template mirror symmetry.

It can be seen that template 302 performs significantly better than Yin's uniformly solid template for dual-field overlay as shown in Table 2 of FIG. 21 in accordance with an embodiment of the present invention.

One aspect to note about the disclosed algorithm is that it can easily accommodate new constraints that might be present in some specific J-FIL applications. For example, one could find an optimized template for only theta errors and reduce the available optimization region to a cross in the center of the template.

Figure 22A:
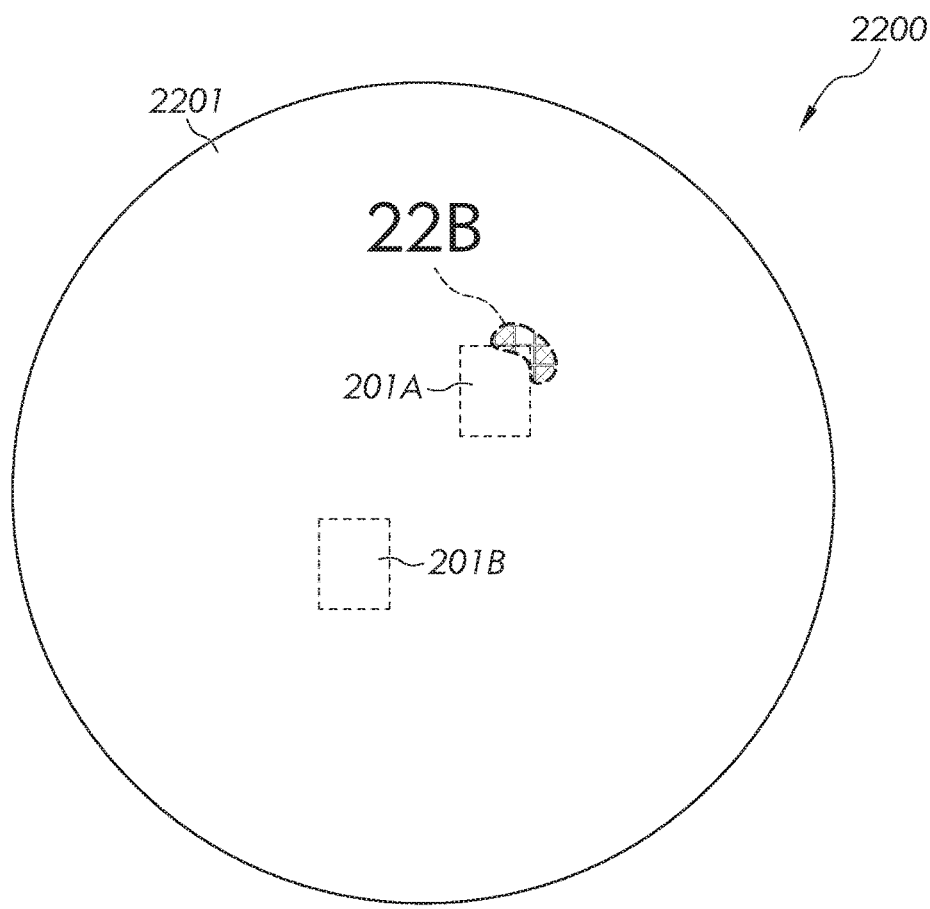
FIGS. 22A-22B illustrate a 300 mm wafer system with a wafer that includes exemplary dual-field configuration and thermal actuators (heaters/coolers) placed underneath in accordance with an embodiment of the present invention.
Figure 22B:
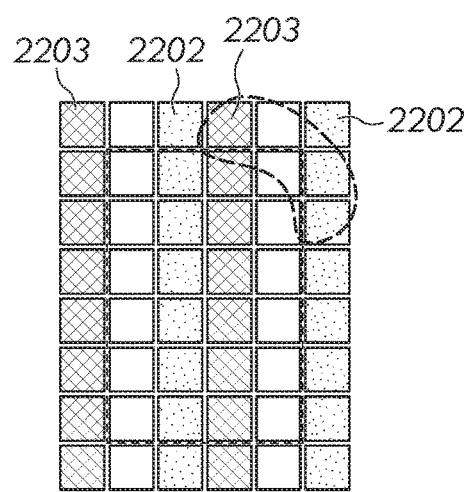

In addition to controlling overlay by actuating template 302, the present invention may control overlay via wafer thermal actuation. In one embodiment, wafer 2201 (FIGS. 22A-22B) is heated and cooled in a controlled fashion at multiple spots in such a way that the resultant thermal expansion and contraction results in overlay reduction (reducing errors, such as translation errors in X and Y, magnification errors in X and Y, orthogonality errors, angular errors and higher order errors in overlay). FIGS. 22A-22B illustrate a 300 mm wafer system 2200 with a wafer 2201 that includes exemplary dual-field configuration 201A-201B and thermal actuators (heaters/coolers) placed underneath in accordance with an embodiment of the present invention.

Referring to FIGS. 22A-22B, in one embodiment, a 6×8 (exemplary) grid of heating/cooling elements 2202, 2203, respectively, is placed underneath each field 201A, 201B. In one embodiment, heating/cooling elements 2202, 2203 operate on the peltier effect. In one embodiment, the rest of wafer 2201 is maintained at room temperature (e.g., 298 Kelvin).

Table 3 of FIG. 12 shows the results of a computer simulation for evaluating the performance of the wafer thermal actuation method in accordance with an embodiment of the present invention.

Since thermal actuators are distributed in an areal fashion, more actuation degrees of freedom can generally be packed per field 201. This, along with the fact that thermal actuators are localized sources of isotropic expansion/contraction means that they can reduce magnification and translation type errors quite well. Also, overlay control does not deteriorate as the number of fields is increased. Thus, if the errors in a certain situation are mainly composed of magnification and translation components, then wafer thermal actuation is an effective solution for dual-field, quad-field and even whole wafer overlay. However, because of the isotropic nature of thermal actuation, theta and gamma errors may not be reduced using thermal actuators alone.

Thermal and template actuation techniques may be combined ("hybrid actuation scheme") in a linear fashion. Table 4 of FIG. 24 shows the simulated performance of the hybrid actuation scheme for gamma and theta errors for dual and quad field cases in accordance with an embodiment of the present invention. For the results in Table 4, template 302 has not been topology optimized.

It can be seen that sub-5 nm dual and quad field overlay is possible using the hybrid actuation scheme.

With respect to the initial error limits for sub-5 nm final overlay using hybrid actuation, in Tables 2-4 (see FIGS. 21, 23 and 24, respectively), actuation performance is evaluated only for six initial error cases, where only one field in a multitude of fields has this error. This is ideal for evaluating how well an actuation scheme performs in independently reducing overlay errors in one field while not affecting the rest. In an actual lithography tool, however, fields might have multiple types of initial errors on every field in a multitude of fields. Error limits have been derived herein, for both dual-field and quad-field overlay, which would ensure sub-5 nm residual overlay using hybrid actuation as shown in Table 5 of FIG. 25. Table 5 of FIG. 25 shows the initial error limits for sub-5 nm final overlay using hybrid actuation in accordance with an embodiment of the present invention. Actuation performance was tested for all combinations of the error cases shown in Table 5 applied on any of the two/four fields. These might serve as useful guidelines during template fabrication.

An important factor in the design of chucks for thermal overlay control is the temperature settling time. High settling time could compromise throughput, which is undesirable since high throughput is the whole objective of multi-field overlay. Temperature settling time depends on the thermal conductivities and thicknesses of the chuck and wafer, and the wafer-chuck and chuck-heater contact resistances.

A common material for making wafer chucks in the semiconductor industry is Silicon Carbide (SiC). Since SiC has a significantly higher surface roughness than silicon, thermal contact between the two is poor. Thus, a regular pin-type SiC chuck would not be ideal here since the wafer-pin contact resistance would be high.

One possible solution is to use a chuck with a light gas, such as helium, filled in the space between the chuck and the wafer. The light gas serves to improve thermal contact using gas conduction. However, the higher back pressure might lead to heat transfer uniformity issues, since the wafer might start losing contact with the pins in some regions. As a result, the chuck may utilize small vacuum pockets to prevent wafer bowing due to gas back-pressure as shown in FIG. 26 in accordance with an embodiment of the present invention. Referring to FIG. 26, chuck 2600 is filled with a light gas 2601, such as helium, surrounded with a seal 2602. Chuck 2600 utilizes an array of vacuum pockets 2603 in the form of annular pins. These pins hold the wafer securely against the wafer chuck 2600 even when the bulk of the space between the wafer and the wafer chuck 2600 is filled with a gas. Such a design enhances thermal conductivity between the wafer and chuck 2600 using gas conduction, while preventing wafer bowing at the same time.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A template, comprising:
multiple lithography fields for imprinting at multiple locations simultaneously; and
multiple holes machined in unpatterned regions to reduce inter-field mechanical coupling and permit overlay control over said multiple lithography fields simultaneously.

2. The template as recited in claim 1, wherein said multiple lithography fields are separated by unpatterned regions.

3. The template as recited in claim 1, wherein imprint material is confined to said multiple lithography fields printed by the use of recessed regions in said unpatterned regions.

4. The template as recited in claim 1, wherein locations of said holes are determined using an optimization algorithm using a population of optimization parameters.

5. The template as recited in claim 4, wherein said optimization parameters comprise a template density matrix and correction force locations.

6. The template as recited in claim 1, wherein locations of said holes are selected based on optimizing overlay errors.

7. The template as recited in claim 1, wherein said overlay control comprises reducing one of the following errors: translation errors in X and Y, magnification errors in X and Y, orthogonality errors and angular errors.

8. The template as recited in claim 1, wherein said overlay control comprises reducing higher order errors in overlay.

9. A wafer system, comprising:
a wafer comprising an array of fields, wherein two or more fields of said array of fields are lithography fields for imprinting at multiple locations simultaneously; and
a grid of heating/cooling elements underneath each of said two or more lithography fields causing thermal expansion and contraction resulting in overlay reduction.

10. The wafer system as recited in claim 9, wherein said overlay reduction comprises reducing one of the following errors: translation errors in X and Y, magnification errors in X and Y, orthogonality errors and angular errors.

11. The wafer system as recited in claim 9, wherein said overlay reduction comprises reducing higher order errors in overlay.

12. The wafer system as recited in claim 9, wherein said heating/cooling elements operate on the peltier effect.

13. A system, comprising:
a template comprising:
multiple lithography fields for imprinting at multiple locations simultaneously; and
multiple holes machined in unpatterned regions to reduce inter-field mechanical coupling and permit overlay control over said multiple lithography fields simultaneously; and
a wafer system comprising:
a wafer comprising an array of fields, wherein two or more fields of said array of fields are lithography fields for imprinting at multiple locations simultaneously; and
a grid of heating/cooling elements underneath each of said two or more lithography fields causing thermal expansion and contraction resulting in overlay control;
wherein said overlay control via said multiple holes and said grid of heating/cooling elements control overlay in a coordinated manner.

14. The system as recited in claim 13, wherein said overlay control comprises reducing one of the following errors: translation errors in X and Y, magnification errors in X and Y, orthogonality errors and angular errors.

15. The system as recited in claim 13, wherein said overlay control comprises reducing higher order errors in overlay.

\* \* \* \* \*